(12) United States Patent
Elford et al.

(10) Patent No.: US 9,716,924 B2
(45) Date of Patent: Jul. 25, 2017

(54) OMEDIA PANEL

(71) Applicant: CenturyLink Intellectual Property LLC, Denver, CO (US)

(72) Inventors: Michael L. Elford, Calhoun, LA (US); Joe Fife, Littleton, CO (US)

(73) Assignee: CenturyLink Intellectual Property LLC, Denver, CO (US)

(*) Notice: Subject to any disclaimer, the term of this patent is extended or adjusted under 35 U.S.C. 154(b) by 0 days.

(21) Appl. No.: 14/519,970

(22) Filed: Oct. 21, 2014

(65) Prior Publication Data
US 2015/0109753 A1    Apr. 23, 2015

Related U.S. Application Data
(60) Provisional application No. 61/893,357, filed on Oct. 21, 2013.

(51) Int. Cl.
*H05K 7/00* (2006.01)
*H04Q 1/02* (2006.01)

(52) U.S. Cl.
CPC .................... *H04Q 1/13* (2013.01)

(58) Field of Classification Search
USPC .......... 361/820, 807, 809, 810; 439/51, 186, 439/210, 214
See application file for complete search history.

(56) References Cited

U.S. PATENT DOCUMENTS

| | | | | |
|---|---|---|---|---|
| 4,647,725 A | * | 3/1987 | Dellinger | H04Q 1/028 379/19 |
| 4,731,809 A | * | 3/1988 | Crane | H04Q 1/028 379/413.04 |
| 5,362,254 A | * | 11/1994 | Siemon | G02B 6/3897 439/142 |
| 5,599,190 A | * | 2/1997 | Willette | H01R 13/518 439/43 |
| 5,735,714 A | * | 4/1998 | Orlando | H01R 13/6658 439/535 |
| 5,978,472 A | * | 11/1999 | Tuvy | H04M 1/0291 379/329 |
| 5,993,265 A | * | 11/1999 | Daoud | H01R 24/62 379/413.04 |
| 6,099,333 A | * | 8/2000 | Daoud | H01R 13/7033 200/51.1 |
| 6,420,964 B1 | * | 7/2002 | Nishikawa | H04L 12/10 340/10.1 |
| 6,435,727 B1 | * | 8/2002 | Fingler | G02B 6/3897 385/137 |

(Continued)

*Primary Examiner* — Hung S Bui
(74) *Attorney, Agent, or Firm* — Swanson & Bratschun, L.L.C.

(57) ABSTRACT

An Omedia panel may be provided that includes an at least one network interface device, a housing, and a front panel. The at least one network interface device might be in communication with a service provider network. The housing may be integrated into a wall of a customer premises and positioned within a wall cavity of the wall. The housing might be configured to support the at least one network interface device. The front panel may be communicatively interfaced with the at least one network interface device such that a user can access one or more ports of the at least one network interface device via the front panel.

18 Claims, 8 Drawing Sheets

(56) References Cited

U.S. PATENT DOCUMENTS

| | | | | |
|---|---|---|---|---|
| 6,457,874 | B1* | 10/2002 | Clapp, Jr. | G02B 6/4277 |
| | | | | 385/75 |
| 7,406,241 | B1* | 7/2008 | Opaluch | G02B 6/4466 |
| | | | | 174/480 |
| 7,474,742 | B2 | 1/2009 | Cook | |
| 7,619,160 | B2* | 11/2009 | Grunwald | G02B 6/4448 |
| | | | | 174/50 |
| D626,069 | S* | 10/2010 | Byrne | D13/139.4 |
| 7,837,397 | B2* | 11/2010 | Fingler | G02B 6/4441 |
| | | | | 385/88 |
| 2008/0013909 | A1* | 1/2008 | Kostet | G02B 6/3851 |
| | | | | 385/135 |
| 2008/0304656 | A1* | 12/2008 | Reed | H04Q 1/028 |
| | | | | 379/442 |
| 2015/0288578 | A1 | 10/2015 | Schwengler et al. | |
| 2016/0150302 | A1* | 5/2016 | Thrithala | H04B 10/40 |
| | | | | 398/45 |

\* cited by examiner

OMEDIA PANEL

CROSS-REFERENCES TO RELATED APPLICATIONS

This application claims priority to U.S. patent Application Ser. No. 61/893,357 (the "'357 Application"), filed Oct. 21, 2013 by Michael L. Elford et al. entitled, "Omedia Panel," the entire disclosure of which is incorporated herein by reference for all purposes.

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present disclosure relates, in general, to optical network terminals, and, more particularly, to installation and configuration of semi-secured optical network terminal based media panels.

BACKGROUND

Optical network terminals ("ONT") are used in fiber-to-the-home systems where service signals are transmitted to and from the customer premises. Fiber optic lines to the home terminate at the ONT. ONTs demultiplex the optical signal from the fiber optic line into its component signals and convert the demultiplexed optical signals to electrical signals. The electrical signals are carried into the home via other communications media, such as category 5 Ethernet cabling and coaxial cabling, or the like. As fiber optic lines do not provide power, the ONT must also be powered separately.

The exposed nature of the numerous lines, connections, ports, and interfaces of an ONT outside the home may cause the ONT to be susceptible to tampering, elemental wear, and/or other damage. Indoor ONTs exist, but also require various cabling from the ONT to different parts of the home. The indoor ONT is still susceptible to damage, and is unaesthetic and cabling is difficult to manage.

Conventional media panels are used within homes to distribute telephone, cable, and data lines inside the home. Media panels provide a localized termination point for the various lines to the home. Connections to these lines can be made available inside the home via an in-wall panel installation. The in-wall portion of the media panel provides ports and connections to the various line terminations for distribution of the connections within the home.

Hence, there is a need for more robust and scalable solutions for providing ONTs (or a system with ONTs) that incorporate power and media panel functionalities, or other like functionalities.

BRIEF SUMMARY

According to a set of embodiments, an Omedia panel may be provided that supports a network interface device ("NID") within its housing, and that is in communication with a service provider network. The housing may be integrated into a wall of the customer premises and positioned within a wall cavity of the wall. The housing may be a space for inserting, holding, or otherwise supporting the NID, or alternatively, the NID may be integrated into the housing such that the housing forms part of the casing of the NID. The Omedia panel also includes a front panel substantially parallel with a front surface of the wall, or that may be set into and flush with the front surface of the wall. The front panel includes interfaces for accessing one or more ports of the NID. The front panel may allow direct access to the ports of the NID, or may alternatively utilize a faceplate having faceplate ports that are coupled to one or more ports of the NID.

In various embodiments, the Omedia panel may receive power from a wall power outlet. In some embodiment, the front panel may plug into a socket of the wall power outlet. In other embodiments, the NID may receive power directly from the wall power outlet. In further embodiments, a low voltage converter may be provided that converts power from the wall power outlet into a low-voltage power signal for the NID.

According to another set of embodiments, an Omedia panel system is provided. The Omedia panel system includes a wall having a front surface and cavity behind the front surface, the wall including a power line coupled to an at least one power outlet, and an Omedia panel coupled to the wall. The Omedia panel includes an at least one NID, a housing positioned with the wall cavity, and a front panel integrated into the front surface of the wall. The housing is configured to support the NID and the front panel includes interfaces for accessing one or more ports of the NID. The front panel may allow direct access to the ports of the NID, or may alternatively utilize a faceplate having faceplate ports that are coupled to one or more ports of the NID.

In various embodiments, the Omedia panel may receive power from a wall power outlet. In some embodiment, the front panel may plug into a socket of the wall power outlet. In other embodiments, the NID may receive power directly from the wall power outlet. In further embodiments, a low voltage converter may be provided that converts power from the wall power outlet into a low-voltage power signal for the NID. In some embodiments, the housing can hold an additional device, such as an uninterruptible power supply, in addition to the NID.

According to another set of embodiments, a method of utilizing and provisioning an Omedia panel is provided. The method includes providing a wall having an Omedia panel. A NID is supported by the housing of the Omedia, and the NID is connected to a service provider network. A front panel of the Omedia panel provides an interface for accessing one or more ports of the NID.

In some embodiments, power is provided to the NID via an at least one power outlet in the wall. In other embodiments, the at least one NID is removable from the housing. In some embodiments, the front panel may utilize a faceplate having one or more faceplate ports that are connected to the one or more communication ports of the NID.

In an aspect, an Omedia panel may comprise at least one network interface device in communication with a service provider network, a housing integrated into a wall of a customer premises, and a front panel communicatively interfaced with the at least one network interface device such that a user can access one or more ports of the at least one network interface device via the front panel. The housing might be positioned within a cavity behind the wall, and the housing might support the at least one network interface device.

According to some embodiments, the at least one network interface device might be an optical network terminal. In some cases, the housing might be configured such that the at least one network interface device can receive power from a power outlet of the wall. In some embodiments, the front panel might be configured to allow a user to access one or more ports of an additional customer device, while the at least one housing might be configured to support the additional customer device. In some instances, the additional customer device might comprise an uninterruptible power supply. The at least one housing might be configured such that the uninterruptible power supply receives power from a power outlet.

In some embodiments, the housing might comprise a casing of the at least one network interface device such that the at least one network interface device is structurally integrated within the wall. In some instances, the at least one network interface device might be a discrete device able to be placed within and removed from the housing such that the at least one network interface device can be replaced. In some cases, the front panel might comprise a faceplate having a plurality of faceplate ports. One or more of the plurality of faceplate ports might be respectively connected to the one or more ports of the at least one network interface device.

In another aspect, an Omedia panel system might comprise a power line and an Omedia panel. The power line might be coupled to at least one power outlet in a wall of a customer premises. The wall might have a front surface and a cavity behind the front surface. The Omedia panel might be coupled to the wall, and might comprise at least one network interface device in communication with a service provider network, a housing integrated into the wall of the customer premises, and a front panel integrated into the front surface of the wall. The housing might be positioned within the cavity of the wall. The housing might support the at least one network interface device. The front panel might be communicatively interfaced with the at least one network interface device, such that a user can access one or more ports of the at least one network interface device via the front panel.

In some embodiments, the housing might be configured such that the at least one network interface device can receive power from the power line. In some cases, the at least one network interface device might be an optical network terminal. According to some embodiments, the system might further comprise an uninterruptible power supply configured to receive power from the power line. The uninterruptible power supply might provide power to the at least one network interface device. The housing might be configured to additionally support the uninterruptible power supply.

In some cases, the housing might comprise a casing of the at least one network interface device, such that the at least one network interface device is structurally integrated within the wall. In some instances, the at least one network interface device might be a discrete device able to be placed within and removed from the housing, such that the at least one network interface device can be replaced. In some embodiments, the front panel further might comprise a faceplate having a plurality of faceplate ports. One or more of the plurality of faceplate ports might be respectively connected to the one or more ports of the at least one network interface device.

In yet another aspect, a method of utilizing an Omedia panel might be provided. The method might comprise providing an integrated Omedia panel disposed within a wall of a customer premises. The Omedia panel might comprise a housing positioned within a cavity of the wall and a front panel integrated into a front surface of the wall. The method might further comprise supporting an at least one network interface device via the housing, connecting the at least one network interface device to a service provider network, and providing an interface via the front panel to one or more ports of the at least one network interface device.

According to some embodiments, the method might further comprise providing power to the at least one network interface device via an at least one power outlet in the wall. In some cases, the method might also comprise removing the at least one network interface device from the housing. In some cases, the front panel might further comprise a face plate having a plurality of faceplate ports, and the method might further comprise connecting one or more of the plurality of faceplate ports to the one or more ports of the at least one network interface device, respectively.

Various modifications and additions can be made to the embodiments discussed without departing from the scope of the invention. For example, while the embodiments described above refer to particular features, the scope of this invention also includes embodiments having different combination of features and embodiments that do not include all of the above described features.

BRIEF DESCRIPTION OF DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF CERTAIN EMBODIMENTS

While various aspects and features of certain embodiments have been summarized above, the following detailed description illustrates a few exemplary embodiments in further detail to enable one of ordinary skill in the art to practice such embodiments. The described examples are provided for illustrative purposes and are not intended to limit the scope of the invention.

In the following description, for the purposes of explanation, numerous specific details are set forth in order to provide a thorough understanding of the described embodiments. It will be apparent to one skilled in the art, however, that other embodiments of the present may be practiced without some of these specific details. In other instances, certain structures and devices are shown in block diagram form. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Unless otherwise indicated, all numbers used herein to express quantities, dimensions, and so forth used should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive.

Figure 1:
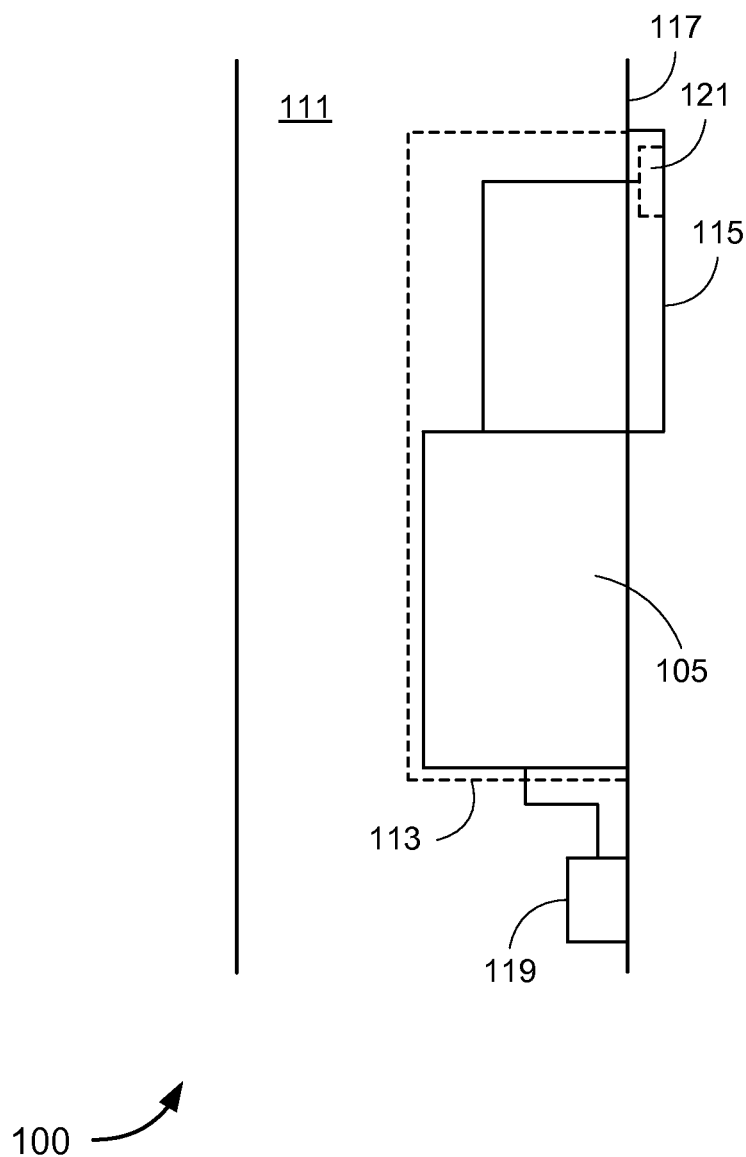
FIG. 1 is a cross-sectional side view of an Omedia panel, according to various embodiments.

FIG. 1 illustrates a cross-sectional side view of an Omedia panel 100, according to various embodiments. Network interface device ("NID") 105 is housed by Omedia panel housing 113 that is contained within the wall cavity 111. Omedia panel housing 113 also includes a front panel 115. The front panel 115 sits substantially parallel against a front drywall surface 117 of the wall. Wall power system 119 comprising a wall outlet power line or wall power outlet is operatively coupled to NID 105, thus powering the NID 105. Housing 113 is configured to allow a wall outlet power line or wall power outlet 119 to power the NID 105. The front panel 115 includes a face plate 121. The NID 105 is coupled to the faceplate 121, which allows a user to connect to one or more ports of the NID 105 via one or more faceplate ports accessible from the faceplate 121.

In the illustrated embodiment, the NID 105 is positioned within housing 113 such that NID 105 sits below the face plate. It is to be understood that in other embodiments, different positioning and configurations for the housing 113 may be used to house the NID 105 within wall cavity 111. For example, in some embodiments, the NID may be positioned in a substantially orthogonal direction to the front drywall surface 117, level with the front panel 115. In some such arrangements, use of the faceplate 121 is optional where the NID 105 is accessible directly from the front panel 115.

In some embodiments, the NID 105 may be removable and may be interchangeable with other types of devices. For example, a user may receive service from a service provider that provides broadband cable services to the customer premises. In such an embodiment, the NID 105 may be a cable modem or other residential gateway, or the like. If the user changes service providers to one that provides optical fiber to the premises, the NID 105 may be interchangeable with a different device, such as an ONT or the like. In other embodiments, the NID 105 may be integrated directly into the housing so as not to be interchangeable. For example, the housing 113 may form part of the casing for the internal components of the NID 105. Thus, in such embodiments, the NID 105 is effectively built into the wall cavity 111.

In some further embodiments, the front panel 115 may include a cutout for the wall power outlet 119, and thus positioned over the wall power outlet 119. In some further embodiments, the cutout may include an interface such that the front panel 115 can plug directly into one of the power sockets of the wall power outlet 119. In some embodiments, the front panel 115 may further couple to a low voltage converter that provides low voltage converted power from wall power outlet 119 to the faceplate 121 or NID 105. In other embodiments, power from wall outlet/power line may be fed directly to a low voltage converter for powering the NID 105.

Figure 2:
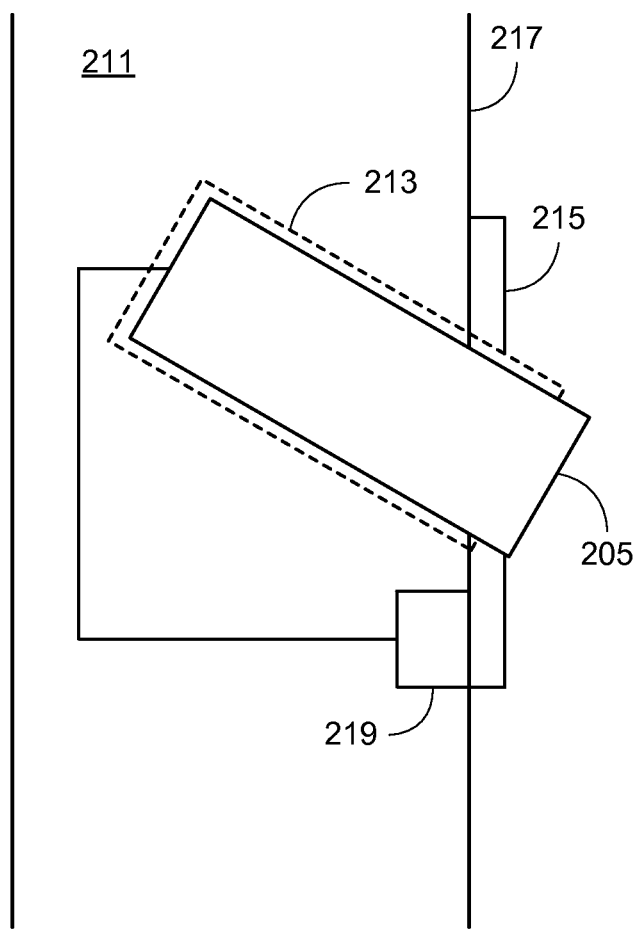
FIG. 2 is a cross-sectional side view of an Omedia panel, according to various alternative embodiments.

FIG. 2 illustrates a cross-sectional side view of an alternative embodiment of an Omedia panel 200. As shown in the embodiment of FIG. 2, NID 205 is housed by Omedia panel housing 213 that extends into a wall cavity 211 of the wall. Omedia panel housing 213 also includes a front panel 215. Omedia panel housing 213 allows NID 205 to be housed at a desired angle relative to the front panel 215 and wall. As in FIG. 1, the front panel 215 is substantially parallel with a front drywall surface 217 of the wall. Wall power outlet 219 is coupled to the back of NID 205, and housing 213 is configured to allow wall power outlet 219 to provide power to the NID 205.

In the illustrated embodiment, the front panel of NID 205 is angled at a downward slope. Thus, the Omedia panel housing 213 allows for an in-wall angled installation of an indoor NID 205. It is to be understood that in some embodiments, angles different from the one depicted may be used to house NID 205. For example, as described with respect to FIG. 1, in some embodiments, the NID 205 may be positioned orthogonally with respect to the front wall surface 217 and front panel 215, such that the front of NID 205 is substantially parallel or flush with front panel 215.

Figure 3:
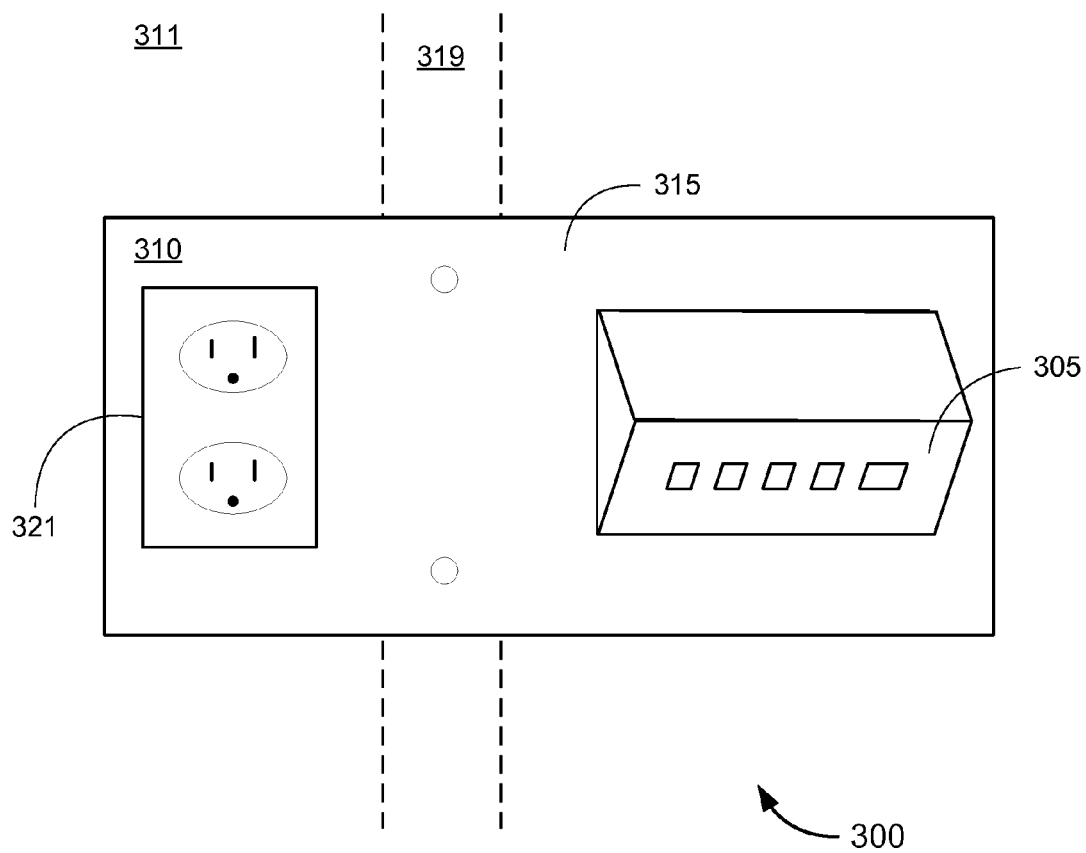
FIG. 3 is a front view of an Omedia panel, according to various embodiments.

FIG. 3 is a front-view 300 of an Omedia panel according to various embodiments. The Omedia panel 310 comprises NID 305, and front panel 315. NID 305 is housed within Omedia panel 310, and has a face (e.g., front face or the like) that points in a downward sloping direction relative to front panel 315. Omedia panel 310 also integrates an alternating current ("AC") wall power outlet 321 into the front panel 315. The Omedia panel 310 is positioned to be integrated into wall 311, and secured to the wall via a connection to stud 319. It will be appreciated by those having skill in the art that in other embodiments, other methods of securing Omedia panel 310 to the wall may be used and is not in any way limited to securing via a stud 319.

In some embodiments, the front panel 315 has a cutout for positioning over wall power outlet 321. In other embodiments, the front panel 315 may plug into one of the sockets of power outlet 321, while allowing access to the remaining socket of wall power outlet, via an expansion socket or otherwise. In some further embodiments, the front panel 315 may further be coupled to a low voltage adapter which converts power from the wall power outlet 321 to a low-voltage power signal for the NID 305, or front panel 315, or both.

Figure 4:
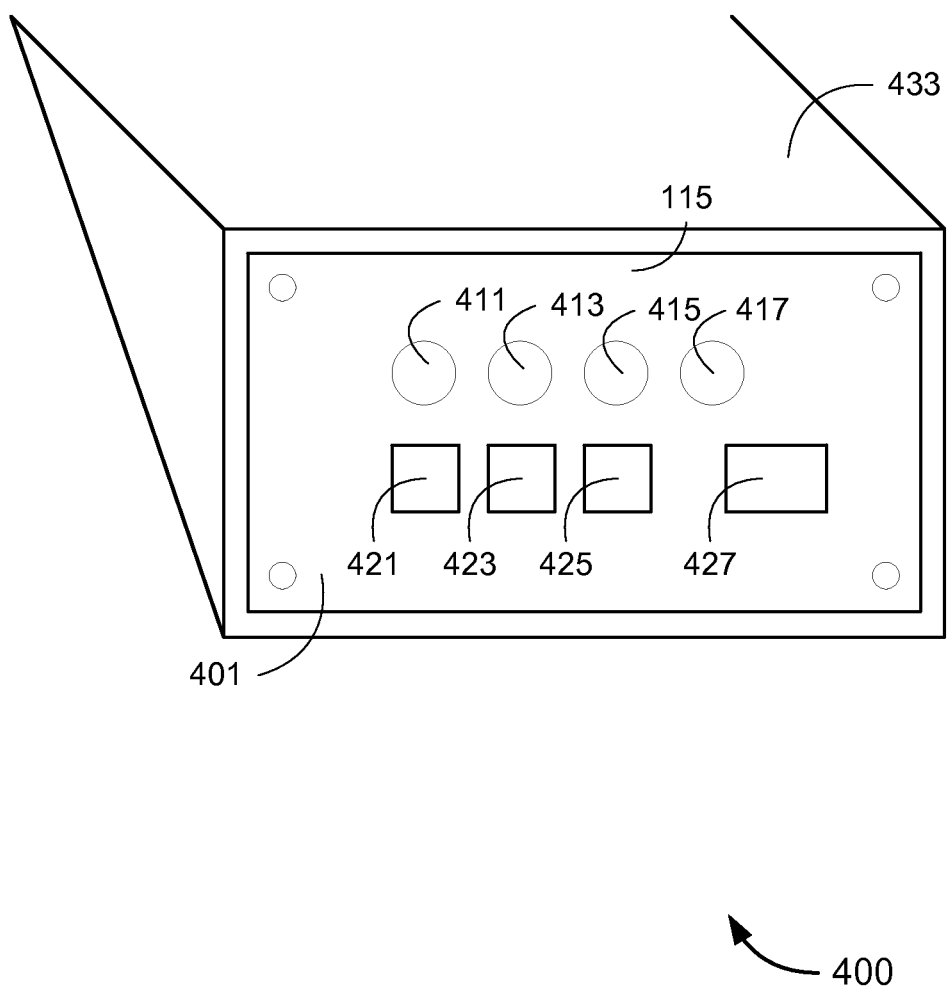
FIG. 4 is a perspective view of a faceplate of an Omedia panel, according to various embodiments.

FIG. 4 is a perspective view of a faceplate of an Omedia panel 400, according to various embodiments. The faceplate 401 covers the opening of housing 433. Housing 433 houses a NID or other device (not shown), including, but not limited to, an uninterruptible power supply ("UPS"), in an in-wall angled installation. Faceplate 401 includes, without limitation, several faceplate ports 411-417 and 421-427. Faceplate ports 411-417 and 421-427 may be input ports and/or output ports that correspond to one or more input ports and/or output ports of the NID or other devices inside the housing 433.

The faceplate ports 411-417 and 421-427 are shown merely by way of example. It will be appreciated by one having ordinary skill in the art that any number of ports (or types of ports) or arrangements may be used so as to support a NID and other additional devices. In one embodiment, faceplate 401 is a part of the NID that protrudes from the front panel and housing 433 so as to be directly accessible to a user. In other embodiments, faceplate 401 has one or more faceplate ports 411-417 and 421-427 "jumpered" corresponding to one or more input/output ports of a NID or other device, as will be described in greater detail below with respect to FIG. 5.

Faceplate ports 411-317 and 421-427 include, but are not limited to, any combination of input or output ports using Ethernet connections, optical fiber connections, RCA video and/or audio connections, a coaxial data connection, plain old telephone service ("POTS") connections, and/or other connections to communicate electronically and/or optically using a fiber optic or cable line to the NID, or the like.

Figure 5:
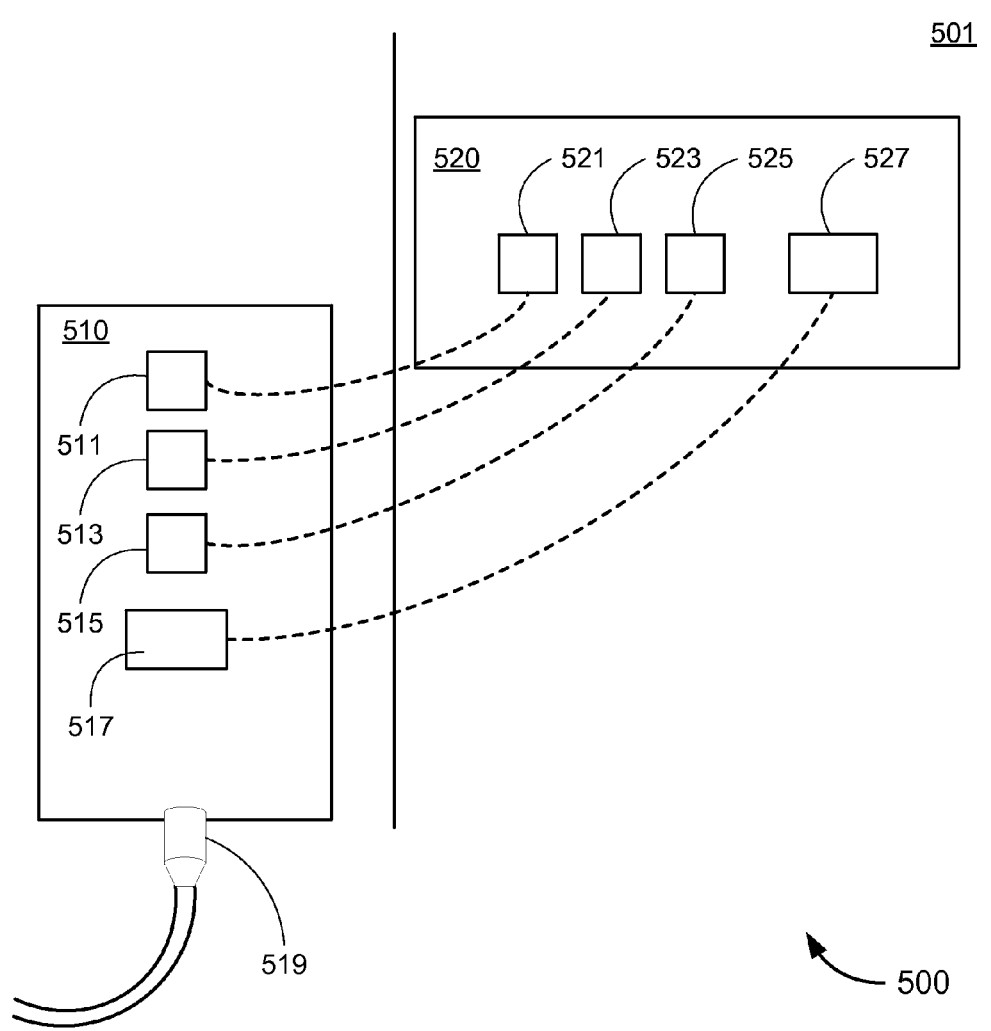
FIG. 5 is a network interface device with jumpered connectors to a faceplate, according to various embodiments of the Omedia panel.

FIG. 5 illustrates an exploded view of an Omedia panel 500 according to one embodiment where the communications interfaces of a NID 510 are jumpered to faceplate ports of faceplate 520 on a front panel 501 of an Omedia panel 500. In the embodiment of FIG. 5, NID communications port 511 is coupled to faceplate port 521 via a jumper line, depicted as dashed lines. Similarly, NID faceplate port 513 is coupled to faceplate port 523; NID communications port 515 is coupled to faceplate port 525; and NID communications port 517 is coupled to connector port 527. Front panel 501 is secured to a front surface of a wall, while NID 510 is positioned within a housing of the Omedia panel behind the wall. Service provider line 519 is coupled to the NID 510, thus allowing the NID to communicate with a service provider network via service provider line 519. In some embodiments, NID 510 might be an ONT, and the service provider line 519 might be an optical fiber line provided to the customer premises. In other embodiments, the NID 510 may be a cable modem or other residential gateway, and the service provider line 519 may be a service provider coaxial cable or phone line. In further embodiments, the NID 510 may not have a wired connection at all and may establish communication with a service provider network through a wireless radio utilizing various wireless communications standards, as known in the art.

As will be appreciated by those skilled in the art, other configurations may be used. For example, in some embodiments, the NID 510 may include more than four communications ports that must be jumpered to the faceplate 520. Thus faceplate 520 may also have a corresponding faceplate ports. In other embodiments, the faceplate may include further routing functionality so as to utilize a single connection from NID 510 to faceplate 520, while allowing other ports of faceplate 520 to be operable to communicate with NID 510. It is to be understood that the faceplate 520 and corresponding faceplate ports are not to be limited to any of the above described embodiments. Rather, connections between the communications ports of the NID 510 and other devices to the faceplate 520 and corresponding faceplate ports may be customized as desired in a given application.

Figure 6:
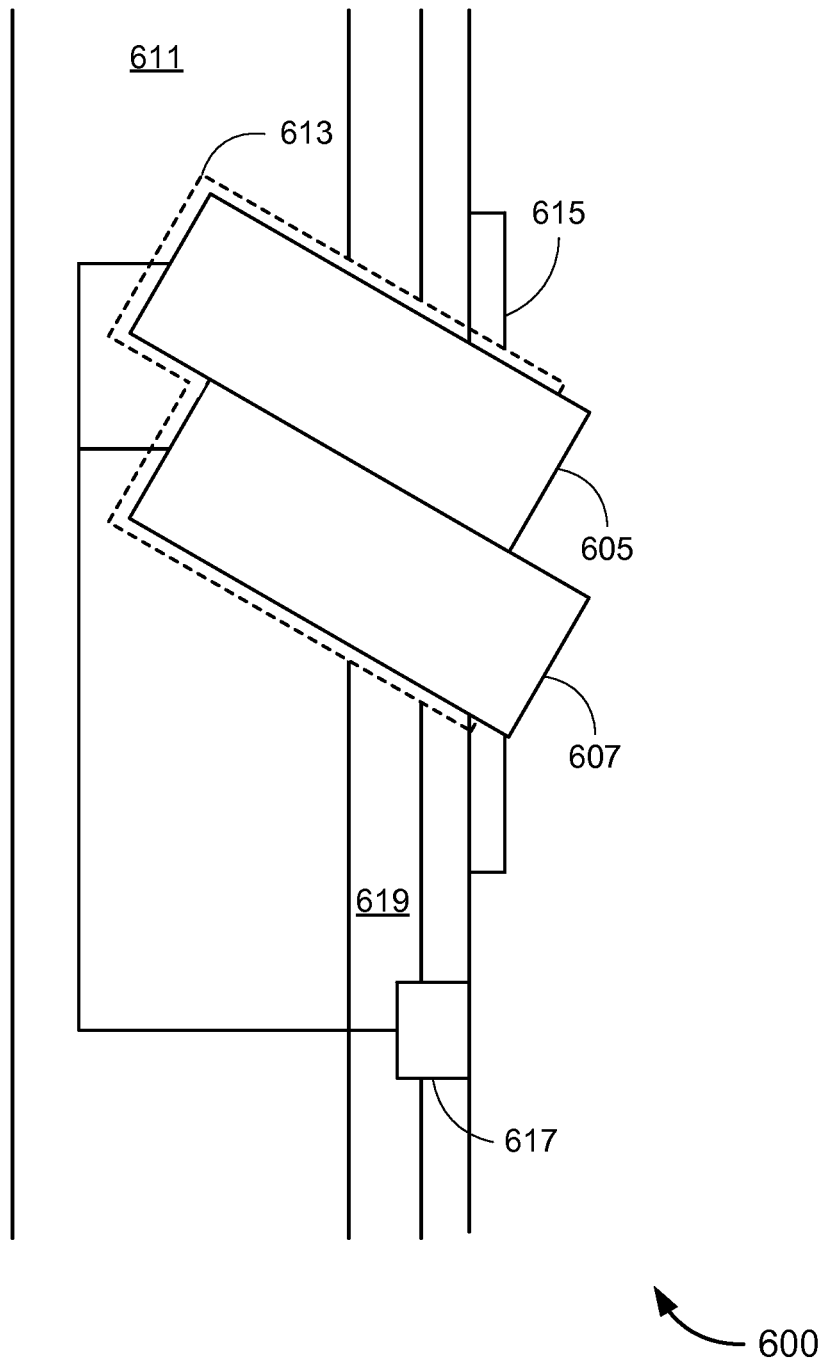
FIG. 6 is a side-view of an Omedia panel having a network interface device and uninterruptible power supply, according to various embodiments.

FIG. 6 is a side view of an in-wall angled installation of an Omedia panel 600 with two modules, in accordance with various embodiments. As shown in the embodiment of FIG. 6, the Omedia panel 600 is installed in wall cavity 611 at a downward facing angle, as described above with respect to FIG. 1. The Omedia panel 600 comprises housing 613 and front panel 615. The Omedia panel is attached to the wall 611 and secured via stud 619. Housing 613 houses two different modules, an upper module 605 and a lower module 607. Wall power outlet 617 is coupled to each of the modules 605 and 607 so as to provide power to both of the modules 605 and 607. In some embodiments, the housing 613 or front panel 615 may further include a low voltage converter as a safety feature between the modules 605, 607 and wall power outlet 617, so as to provide a low voltage converted power signal to the modules 605, 607. In some embodiments, the low voltage converter may be plugged directly into one of the sockets of wall power outlet 617 and may be configured to be easily disconnected from the socket of wall power outlet 617. In such a configuration, the low voltage converter can act as an emergency quick-disconnect to remove power to the modules 605, 607.

In one embodiment, upper module 605 is an indoor NID and lower module 607 is an UPS. In other embodiments, two NIDs may be used. In yet other embodiments, the order of the modules may be switched, such that the UPS is the upper module 605 and the NID is the lower module 607.

Although FIG. 6 depicts a stacked arrangement of the two modules 605, 607, it is to be understood that in other embodiments, other arrangements may be utilized. For example, in various embodiments, upper module 605, lower module 607, or both modules 605, 607 may be positioned substantially orthogonal to the front surface of the wall. In some embodiments, the modules 605, 607 may be housed so as not to be accessible directly from the front panel 615. Thus, in such embodiments, the modules 605, 607 may be coupled to a faceplate.

Figure 7:
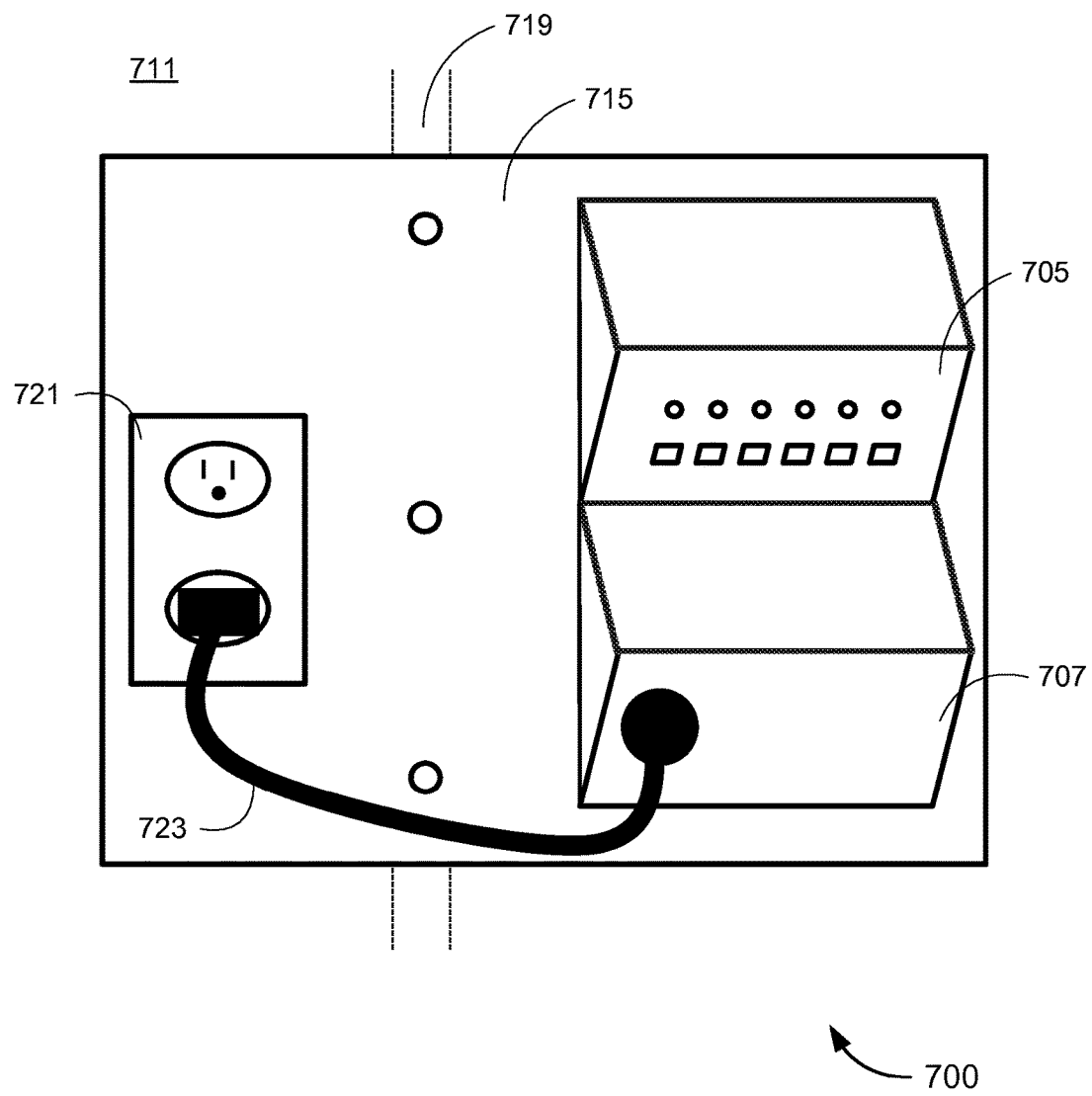
FIG. 7 is a front view of an Omedia panel having a network interface device and uninterruptible power supply, according to various embodiments.

FIG. 7 is a front view of an in-wall angled installation of an Omedia panel 700 with two modules, according to various embodiments. The Omedia panel 700 includes a front panel 715, and houses an upper module 705, a lower module 707, and an integrated AC wall power outlet 721. The Omedia panel is attached to a wall 711 and secured via stud 719. Upper module 705 may be a NID having various communications ports accessible from the Omedia panel. Lower module 707 may be an UPS. The UPS 707 might be coupled to wall power outlet 721 via power cord 723. In other embodiments, the UPS 707 may receive power from wall power outlet 721 from behind the wall via a connection through the housing. In one embodiment, the UPS may be configured to provide power to the NID of upper module 705. Because optical fiber lines to the home do not provide power for line equipment, the UPS serves to power the NID and also any equipment that may need powering from a line connection to the Omedia panel. In some embodiments, the integrated AC power outlet 721 may be built into the Omedia panel and a power line may be connected separately to the Omedia panel. In other embodiments, the Omedia panel provides a housing or cutout to integrate an existing wall power outlet 721 in the wall 711 into the front panel 715. In some embodiments, the front panel 715 may plug directly into a socket of the wall power outlet 721 providing power to the UPS 707.

Figure 8:
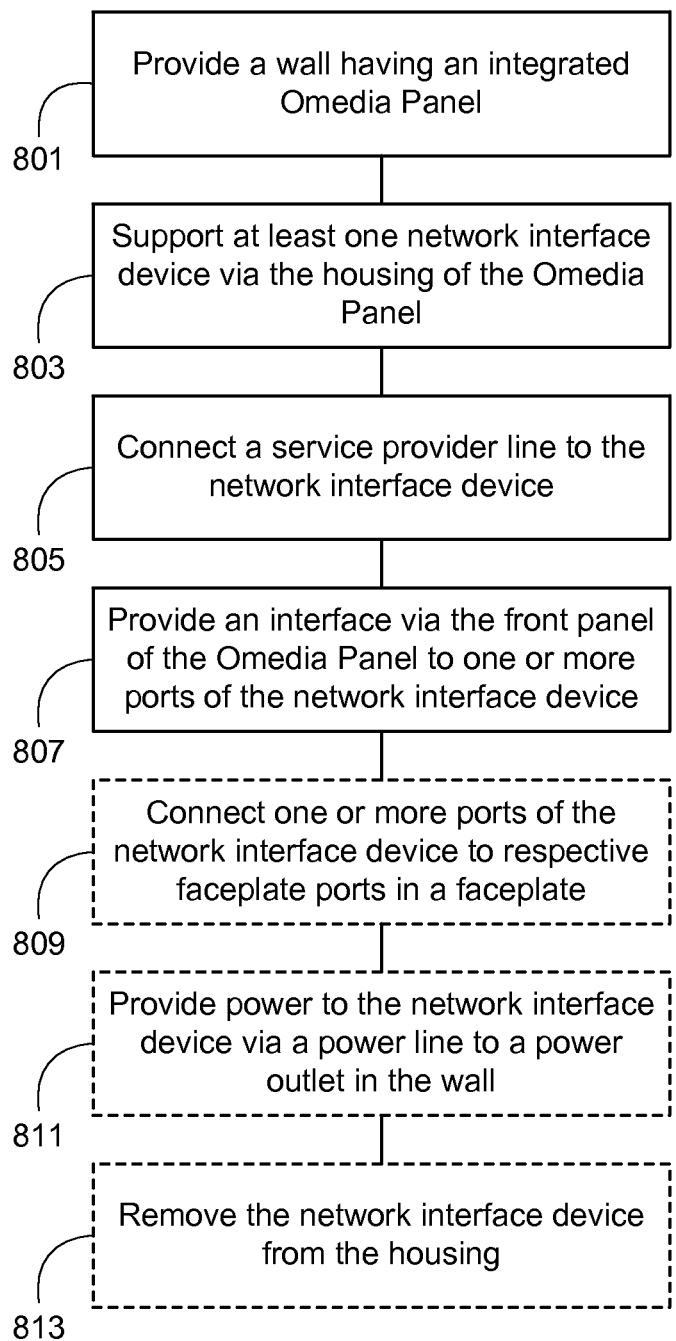
FIG. 8 is a flow diagram of a method for utilizing an Omedia panel for network services, according to various embodiments.

FIG. 8 is a flow chart of a method 800 for utilizing and provisioning service to an Omedia panel, according to various embodiments. At block 801, a wall having an integrated Omedia panel may be provided. The Omedia panel might include a housing positioned within a cavity of the wall. The Omedia panel might also include a front panel that runs substantially parallel or flush with the front surface of the wall.

At block 803, at least one NID might be supported via the housing of the Omedia panel. In some embodiments, the at least one NID may be implemented in a removable fashion where it can be removed from and inserted into the housing. In other embodiments, the NID may be integrated into the housing of the Omedia panel such that the housing forms at least part of a casing for the internal components of the NID.

At block 805, the at least one NID might be connected to a service provider network. In some embodiments, a service provider line may be connected to the NID. The service line includes, but is not limited to, an optical fiber line, a coaxial cable line (or coax line), a telephone line, or any other line that connects the NID to a service provider network. In other embodiments, the NID may connect to a service provider network wirelessly, as described above with respect to FIG. 5.

At block 807, an interface might be provided, via the front panel, to one or more ports to the network interface device. In some embodiments, the front panel might provide direct access to the one or more ports of the NID. In other embodiments, the front panel may include a faceplate that is communicatively coupled to one or more ports of the NID. For example, at optional block 809, one or more ports of the NID might be coupled to one or more respective faceplate ports of a faceplate of the front panel. In some embodiments, the one or more ports of the NID are jumpered to respective faceplate ports.

At optional block 811, power might be provided to the at least one NID. In some embodiments, power might be provided via a wall power outlet to the at least one NID. In other embodiments, power may be provided via a power line to the wall power outlet. In yet further embodiments, the front panel may plug directly into a socket of the wall power outlet to provide power to the at least one NID.

At optional block 813, the at least one NID might be removed from the housing of the Omedia panel. In various embodiments, the at least one NID may be removed for repair, replacement, or to provide functionality for different types of services.

While certain features and aspects have been described with respect to exemplary embodiments, one skilled in the art will recognize that numerous modifications are possible. While certain functionality is ascribed to certain system components, unless the context dictates otherwise, this functionality can be distributed among various other system components in accordance with the several embodiments. Thus, it is to be understood that the one and two module embodiments are provided by way of example only, and that in other embodiments, the Omedia panel may have more than two modules, and can support multiple different types of ONTs and other types of modules.

Moreover, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with—or without—certain features for ease of description and to illustrate exemplary aspects of those embodiments, the various components and/or features described herein with respect to a particular embodiment can be substituted, added, and/or subtracted from among other described embodiments, unless the context dictates otherwise. Consequently, although several exemplary embodiments are described above, it will be appreciated that the invention is intended to cover all modifications and equivalents within the scope of the following claims.

What is claimed is:

1. An Omedia panel, comprising:
   at least one network interface device in communication with a service provider network, the at least one network interface device comprising an optical network terminal (ONT) and being a demarcation point between a customer premises and the service provider network;
   a housing integrated into a wall of the customer premises, the housing positioned within a cavity behind the wall, wherein the housing supports the at least one network interface device internally within the Omedia panel, and wherein the housing enables the at least one network interface device to be housed at a desired angle to the wall; and
   a front panel communicatively interfaced with the at least one network interface device such that a user can access one or more ports of the at least one network interface device via the front panel.

2. The panel of claim 1, wherein the housing is configured such that the at least one network interface device can receive power from a power outlet of the wall.

3. The panel of claim 1, wherein:
   the front panel is configured to allow a user to access one or more ports of an additional customer device; and
   the at least one housing is configured to support the additional customer device.

4. The panel of claim 3, wherein the additional customer device comprises an uninterruptible power supply.

5. The panel of claim 4, wherein the at least one housing is configured such that the uninterruptible power supply receives power from a power outlet.

6. The panel of claim 1, wherein the housing comprises a casing of the at least one network interface device such that the at least one network interface device is structurally integrated within the wall.

7. The panel of claim 1, wherein the at least one network interface device is a discrete device able to be placed within and removed from the housing such that the at least one network interface device can be replaced.

8. The panel of claim 1, wherein the front panel comprises a faceplate having a plurality of faceplate ports, wherein one or more of the plurality of faceplate ports are respectively connected to the one or more ports of the at least one network interface device.

9. An Omedia panel system, comprising:
   a power line coupled to at least one power outlet in a wall of a customer premises, the wall having a front surface and a cavity behind the front surface;
   an Omedia panel coupled to the wall, the Omedia panel comprising:
      at least one network interface device in communication with a service provider network, the at least one network interface device comprising an optical network terminal (ONT) and being a demarcation point between the customer premises and the service provider network;
      a housing integrated into the wall of the customer premises, the housing positioned within the cavity of the wall, wherein the housing supports the at least one network interface device internally within the Omedia panel, and wherein the housing enables the at least one network interface device to be housed at a desired angle to the wall; and a front panel integrated into the front surface of the wall, wherein the front panel is communicatively interfaced with the at least one network interface device, such that a user can access one or more ports of the at least one network interface device via the front panel.

10. The system of claim 9, wherein the housing is configured such that the at least one network interface device can receive power from the power line.

11. The system of claim 9, further comprising:

an uninterruptible power supply configured to receive power from the power line, wherein the uninterruptible power supply provides power to the at least one network interface device, wherein the housing is configured to additionally support the uninterruptible power supply.

12. The system of claim 9, wherein the housing comprises a casing of the at least one network interface device, such that the at least one network interface device is structurally integrated within the wall.

13. The system of claim 9, wherein the at least one network interface device is a discrete device able to be placed within and removed from the housing, such that the at least one network interface device can be replaced.

14. The system of claim 9, wherein the front panel further comprises a faceplate having a plurality of faceplate ports, wherein one or more of the plurality of faceplate ports are respectively connected to the one or more ports of the at least one network interface device.

15. A method of utilizing an Omedia panel, comprising:

providing an integrated Omedia panel disposed within a wall of a customer premises, the Omedia panel comprising a housing positioned within a cavity of the wall and a front panel integrated into a front surface of the wall;

supporting at least one network interface device, via the housing, internally within the Omedia panel, wherein the housing enables the at least one network interface device to be housed at a desired angle to the wall;

connecting the at least one network interface device to a service provider network, wherein the at least one network interface device comprises an optical network terminal (ONT) and is a demarcation point between the customer premises and the service provider network; and providing an interface via the front panel to one or more ports of the at least one network interface device.

16. The method of claim 15, further comprising:

providing power to the at least one network interface device via an at least one power outlet in the wall.

17. The method of claim 15, further comprising:

removing the at least one network interface device from the housing.

18. The method of claim 15, wherein the front panel further comprises a face plate having a plurality of faceplate ports, the method further comprising:

connecting one or more of the plurality of faceplate ports to the one or more ports of the at least one network interface device, respectively.

* * * * *